(12) United States Patent
Kim (10) Patent No.: US 8,604,462 B2
(45) Date of Patent: Dec. 10, 2013

(54) PHOTODETECTOR

(75) Inventor: Jin Tae Kim, Daejeon (KR)

(73) Assignee: Electronics & Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/560,703

(22) Filed: Jul. 27, 2012

(65) Prior Publication Data

US 2013/0026442 A1   Jan. 31, 2013

(30) Foreign Application Priority Data

Jul. 29, 2011  (KR) .................. 10-2011-0076244

(51) Int. Cl.
*H01L 29/06* (2006.01)
(52) U.S. Cl.
USPC .. 257/29; 257/9; 257/E21.404; 257/E29.245; 257/E31.001; 977/938
(58) Field of Classification Search
USPC .......... 257/9, 29, E21.404, E29.24, E31.001; 977/938
See application file for complete search history.

(56) References Cited

U.S. PATENT DOCUMENTS

| | | | |
|---|---|---|---|
| 2010/0258787 A1 | 10/2010 | Chae et al. | |
| 2011/0042650 A1 | 2/2011 | Avouris et al. | |
| 2012/0161106 A1 | 6/2012 | Kim et al. | |
| 2013/0015375 A1* | 1/2013 | Avouris et al. | 250/504 R |
| 2013/0048951 A1* | 2/2013 | Heo et al. | 257/29 |
| 2013/0193410 A1* | 8/2013 | Zhu | 257/29 |

FOREIGN PATENT DOCUMENTS

| | | |
|---|---|---|
| KR | 10-2010-0111999 A | 10/2010 |
| KR | 10-2011-0020443 A | 3/2011 |

OTHER PUBLICATIONS

Thomas Mueller, et al., "Graphene photodetectors for high-speed optical communications," Nature Photonics, vol. 4, Mar. 2010, pp. 297-301.
Fengnian Xia, et al., "Ultrafast graphene photodetector," Nature Nanotechnology, vol. 4, Oct. 11, 2009, pp. 839-843.

* cited by examiner

*Primary Examiner* — David S Blum (57) ABSTRACT

A photodetector includes: a substrate; a first dielectric material positioned on the substrate; an optical waveguide positioned on the first dielectric material; a second dielectric material positioned on the optical waveguide; a graphene layer positioned on the second dielectric material; and a first electrode and a second electrode that are positioned on the graphene layer.

19 Claims, 6 Drawing Sheets

PHOTODETECTOR

CROSS-REFERENCE TO RELATED APPLICATION

This application claims priority to and the benefit of Korean Patent Application No. 10-2011-0076244 filed in the Korean Intellectual Property Office on Jul. 29, 2011, the entire contents of which are incorporated herein by reference.

BACKGROUND OF THE INVENTION (a) Field of the Invention

The present invention relates to a photodetector, and more particularly, to a photodetector including graphene.

(b) Description of the Related Art

A typical photodetector detects light or electromagnetic waves, and can be used for optical communication. A photodetector used for optical communication is made based on a group III-V compound semiconductor gallium arsenide.

A semiconductor-based photodetector is configured to have a unique bandgap according to the type of semiconductor and to operate when light having a greater energy than the bandgap is incident thereto.

That is, the semiconductor functions as a photodetector in such a manner that it absorbs photons from light incident on the semiconductor, electron and hole pairs are separated to generate currents, and the currents are measured.

SUMMARY OF THE INVENTION

However, a unique bandwidth of the semiconductor-based photodetector is limited by the transit time of carriers into a detection area, and light is incident on a plane perpendicular to the detection area, thus making it difficult to detect parallel incident light.

The present invention has been made in an effort to provide a photodetector with wide wavelength selectivity and a wide bandwidth.

An exemplary embodiment of the present invention provides a photodetector including: a substrate; a first dielectric material positioned on the substrate; an optical waveguide positioned on the first dielectric material; a second dielectric material positioned on the optical waveguide; a graphene layer positioned on the second dielectric material; and a first electrode and a second electrode that are positioned on the graphene layer.

The photodetector may further include: a third dielectric material positioned on the first electrode and the second electrode; and a third electrode positioned on the third dielectric material, wherein the third electrode may be positioned between the first electrode and the second electrode and overlap with the optical waveguide.

A gate voltage may be applied to the optical waveguide or the third electrode.

The refractive index of the optical waveguide may be different from that of the first dielectric material, and the optical waveguide may be made of silicon or silicon nitride.

An optical signal may be applied to a side surface of the optical waveguide.

The optical signal may be a digital signal containing 0's and 1's.

The graphene layer may be made of a single layer or multiple layers.

Another embodiment of the present invention provides a photodetector including: a substrate; a first dielectric material positioned on the substrate; an optical waveguide layer positioned on the first dielectric material and including an optical waveguide and an extended portion connected to the optical waveguide; a second dielectric material positioned on the optical waveguide layer and overlapping with the optical waveguide; a graphene layer positioned on the second dielectric material; and a first electrode and a second electrode that are positioned on the graphene layer.

The first electrode and the second electrode may be in direct contact with the graphene layer.

The first electrode and the second electrode may be made of metals having different work functions.

The first electrode may be made of Ti/Au, and the second electrode may be made of Pd/Au.

The first electrode and the second electrode each may include a stem portion overlapping with the second dielectric material and a plurality of branch portions connected to the stem portion and overlapping with the graphene layer, wherein the branch portions of the first electrode and the branch portions of the second electrode may alternate with each other.

A source voltage or drain voltage may be applied to the first electrode or the second electrode.

The photodetector may further include a third electrode positioned on the extended portion of the optical waveguide layer.

The third electrode may be in direct contact with the optical waveguide layer.

An optical signal may be applied to a side surface of the optical waveguide, and the optical signal may be a digital signal containing 0's and 1's.

The graphene layer may be made of a single layer or multiple layers.

The photodetector according to the present invention can be used as a wide band detector because graphene can be used to detect light incident on a side surface of the optical waveguide along the optical waveguide.

Moreover, it is possible to provide a photodetector which is operable even at a low voltage since the photodetector includes a graphene layer having high electrical conductivity.

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a photodetector using graphene according to an exemplary embodiment of the present invention will be concretely described with reference to FIGS. 1 to 5.

Figure 1:
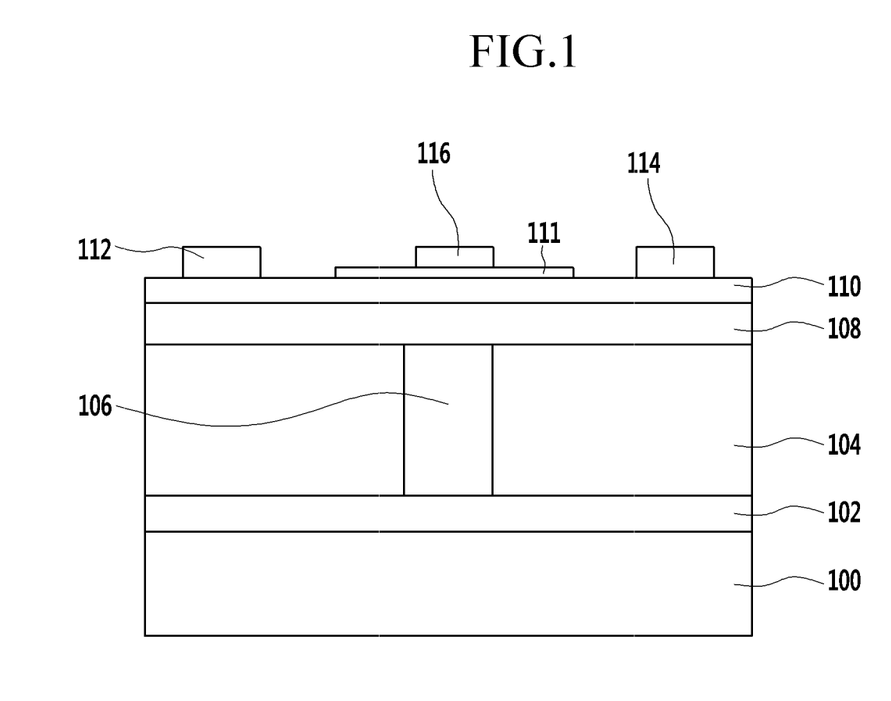
FIG. 1 is a schematic cross-sectional view of a photodetector according to an exemplary embodiment of the present invention.
Figure 2:
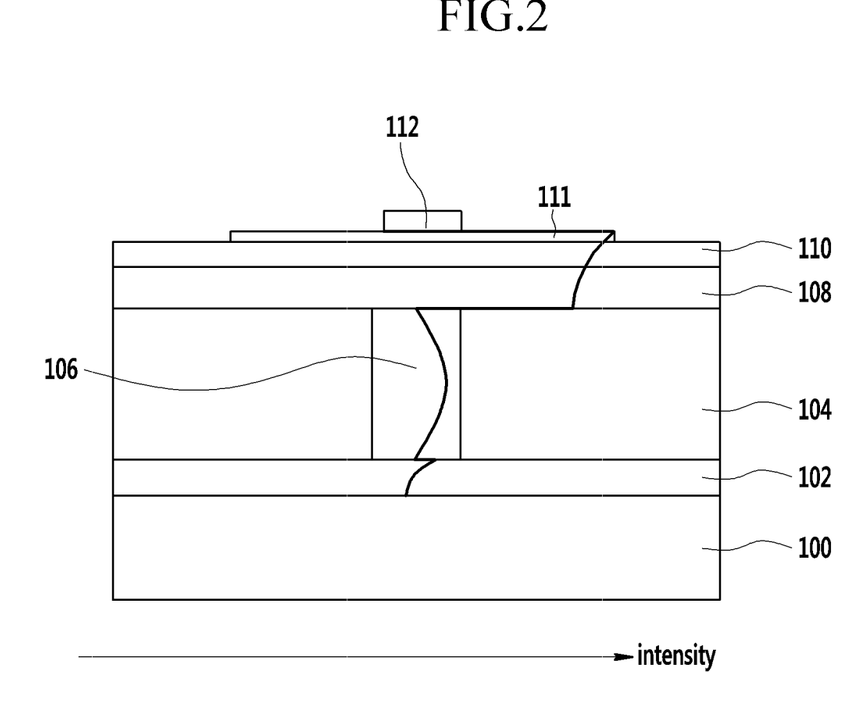
FIG. 2 is a view schematically showing the intensity of the Ey field relative to the location of the photodetector.
Figure 3:
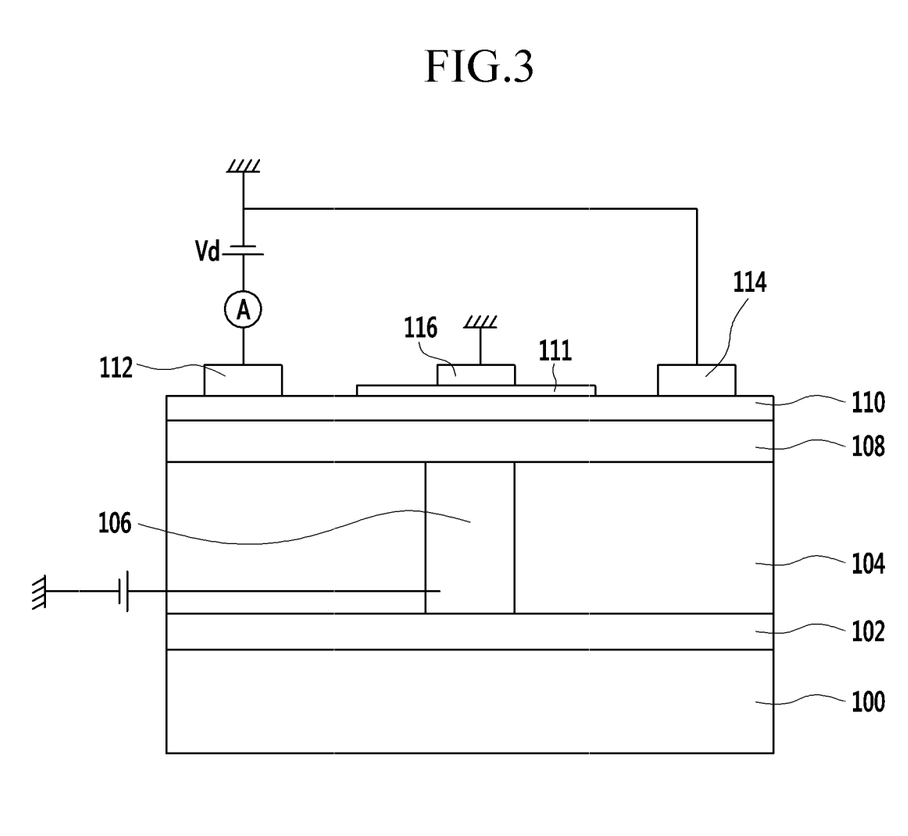
FIG. 3 is a view schematically showing a voltage applied to the photodetector according to an exemplary embodiment of the present invention.
Figure 4:
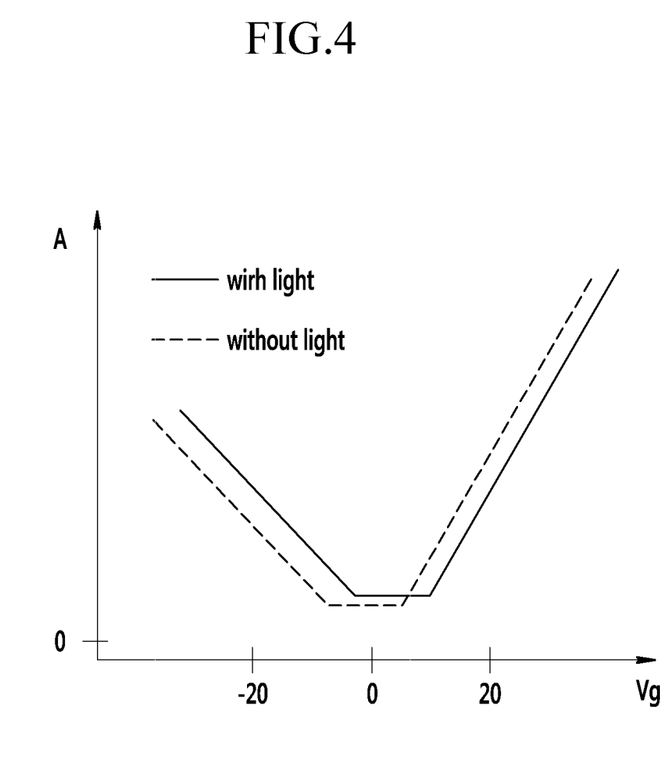
FIG. 4 is a graph showing a current flow in the photodetector according to an exemplary embodiment of the present invention.
Figure 5:
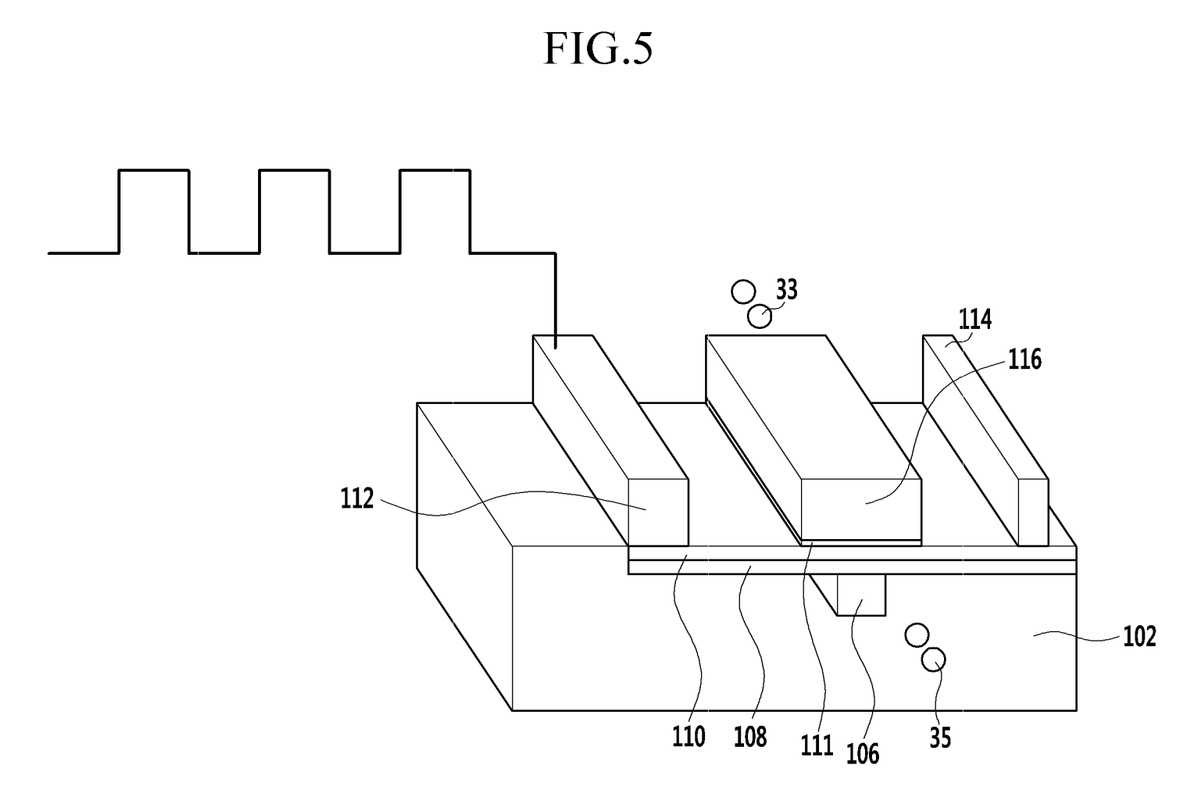
FIG. 5 is a view for explaining the measurement of an optical signal in the photodetector according to an exemplary embodiment of the present invention.

FIG. 1 is a schematic cross-sectional view of a photodetector according to an exemplary embodiment of the present invention. FIG. 2 is a view schematically showing the intensity of the Ey field relative to the location of the photodetector. FIG. 3 is a view schematically showing a voltage applied to the photodetector according to an exemplary embodiment of the present invention. FIG. 4 is a graph showing a current flow in the photodetector according to an exemplary embodiment of the present invention. FIG. 5 is a view for explaining the measurement of an optical signal in the photodetector according to an exemplary embodiment of the present invention.

As shown in FIG. 1, the photodetector according to the present invention includes a substrate 100, a first dielectric material 102, a second dielectric material 104 positioned on the first dielectric material 102, an optical waveguide 106 positioned on the second dielectric material 104, a third dielectric material 108 positioned on the optical waveguide 106, a graphene layer 110 positioned on the third dielectric material 108, and a first electrode 112, a second electrode 114, and a third electrode 116 that are positioned on the graphene layer 110.

The substrate 100 may be made of silicon or the like.

Although the first dielectric material 102, the second dielectric material 104, and the third dielectric material 108 have been illustrated as different layers for convenience of explanation, they may be formed of the same material. According to a manufacturing method, the first dielectric material 102, the second dielectric material 104, and the third dielectric material 108 may be formed individually. Alternatively, the first dielectric material 102 and the second dielectric material 104 may be simultaneously formed, or the second dielectric material 104 and the third dielectric material 108 may be simultaneously formed.

The first dielectric material 102, the second dielectric material 104, and the third dielectric material 108 may be made of silicon oxide or silicon nitride.

Preferably, the optical waveguide 106 is formed of a material having a difference in refractive index from that of the third dielectric material 108, for example, silicon (Si).

Graphene of the graphene layer 110 is made of a single layer or multiple layers of carbon atoms held together by covalent bonds. At this point, each carbon atom layer contains cyclic units of six-membered rings, or may further contain five- or seven-membered rings. Graphene is flexible, has high electrical conductivity, and is transparent.

The first electrode 112, the second electrode 114, and the third electrode 116 may be made of a single layer or multiple layers of conductive metals such as Au, Ti, Pd, etc.

The photodetector of FIG. 1 shows the electric (Ey) field distribution in a vertical direction as shown in FIG. 2 when an optical signal is applied to the optical waveguide. At this point, waveguided light is transverse-magnetic (TM) polarized light.

In the photodetector according to an exemplary embodiment of the present invention, if there is a difference in refractive index between the first dielectric material 102 and the optical waveguide 106 when an optical signal is applied to the optical waveguide, a strong field due the discontinuity of a vertical electric field (Ey field) is excited at the interface between the first dielectric material 102 and the optical waveguide 106 as shown in FIG. 2. The greater the difference in refractive index, the stronger the excited electric field. Accordingly, the refractive index ratio of the optical waveguide 106 to the first dielectric material 102 or the refractive index ratio of the first dielectric material 102 to the optical waveguide 106 is preferably greater than 1.

For instance, the optical waveguide 106 is made of silicon with a dielectric constant of 3.4 at an optical wavelength of 1550 nm, and the first dielectric material 102 is preferably made of silicon oxide with a refractive index of 1.44.

Also, a strong field is excited by a field induced by surface plasmon between the third electrode 116 and a fourth dielectric material 111 and a field due to a discontinuity of a vertical field (Ey field) by a difference in refractive index between the optical waveguide 106 and the dielectric material 102.

As shown in FIG. 2, the greater the discontinuity of a vertical field, the stronger the excited field. Also, electron-hole pairs are formed in the graphene layer due to the excited field, and therefore currents may flow between the first electrode 112 and the second electrode 114.

As shown in FIG. 3, when a given voltage is applied between the first electrode 112 and the second electrode 114, the current between the first electrode 112 and the second electrode 114 may increase.

Moreover, as shown in FIG. 3, when the third electrode 116 is connected to the ground and a given voltage is applied to the optical waveguide 106, the carrier density of the graphene layer 110 increases, and the current between the first electrode 112 and the second electrode 114 increases due to the effect of a field effect transistor.

On the contrary, the optical waveguide 106 may be connected to the ground, and a given voltage may be applied (not shown) to the third electrode 116 to increase the currents.

The voltages applied to the first electrode 112 and the second electrode 114 may be respectively a source voltage Vs and a drain voltage Vs, and the voltage applied to the third electrode 116 or the optical waveguide 106 may be a gate voltage Vg.

FIG. 4 is a graph showing the current versus gate voltage (Vg) of a photodetector according to an exemplary embodiment of the present invention.

Referring to FIG. 4, it can be seen that, regardless of the polarity of the gate voltage, the higher the gate voltage, the larger the current of the photodetector. This means that the carrier density of the graphene layer increases with an increase in gate voltage, and therefore the current between the first electrode and the second electrode increases.

As explained above, the photodetector as shown in FIG. 5 can be formed by forming a current flow between the first electrode 112 and the second electrode 114 by using the optical waveguide 106 and the graphene layer 110.

As shown in FIG. 5, when an optical signal 33 containing 0's and 1's is applied to the optical waveguide, the intensity of an optical signal 35 having passed through the optical waveguide is reduced.

Also, the optical signal 33 applied to the optical waveguide 106 produces electron-hole pairs in the graphene layer 110 to form a channel, and current flows from the first electrode 112 to the second electrode 114. Accordingly, an electric signal can be obtained by measuring the current flowing between the first electrode 112 and the second electrode 114.

At this point, to increase the current between the first electrode 112 and the second electrode 114, a gate voltage Vg may be applied to the third electrode 116 or the optical waveguide 106, and a source voltage Vs and a drain voltage Vd may be respectively applied to the first electrode 112 and the second electrode 114.

Figure 6:
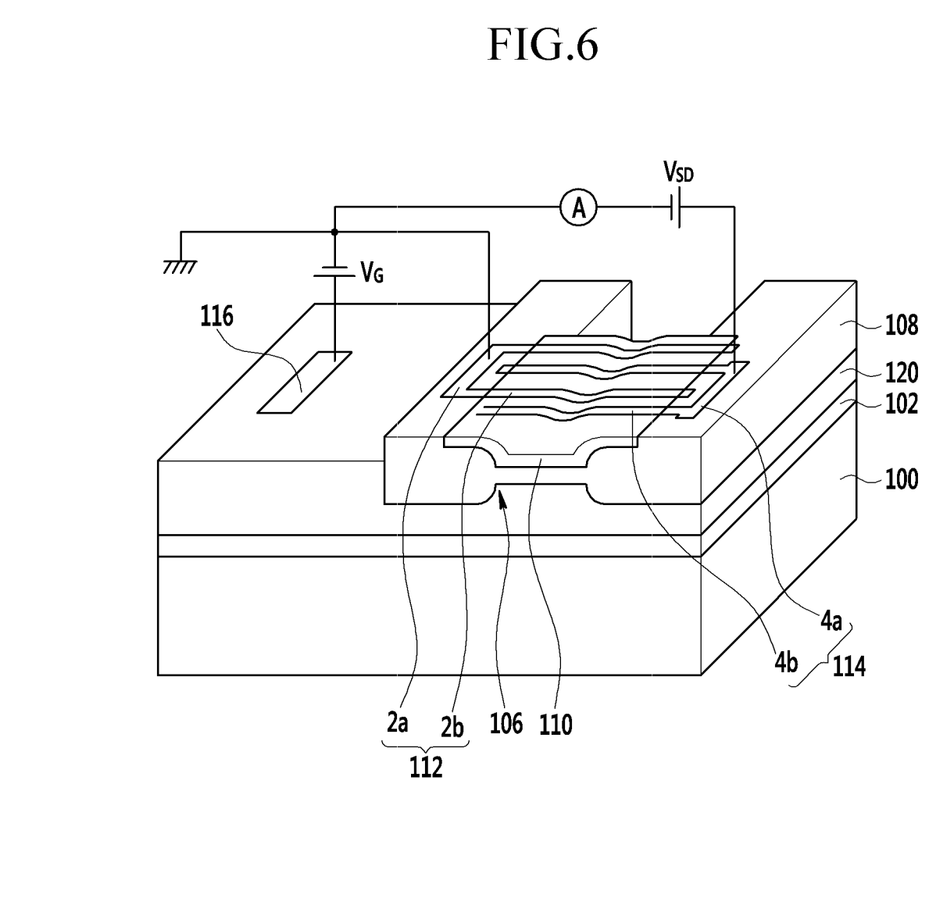
FIG. 6 is a view showing a photodetector according to another exemplary embodiment of the present invention.

FIG. 6 is a view showing a photodetector according to another exemplary embodiment of the present invention.

Referring to FIG. 6, the photodetector includes a substrate 100, a first dielectric material 102 formed on the substrate 100, and an optical waveguide layer 120 positioned on the first dielectric material 102.

Also, a third dielectric material 108 is formed on the optical waveguide layer 120. Unlike the photodetector of FIG. 1, the third dielectric material 108 is positioned within the boundary line of the optical waveguide layer 106, and the optical waveguide layer 120 is exposed outside the third dielectric material 108.

A graphene layer 110 is formed on the third dielectric material 108, and the graphene layer 110 is positioned within the boundary line of the third dielectric material 108 so that the third dielectric material 108 is exposed outside the graphene layer 110.

The optical waveguide layer 120 includes an extended portion exposed outside the boundary line of the third dielectric material 108 and an optical waveguide 106 connected to the extended portion and overlapping with the third dielectric material 108 and the graphene layer 110. An optical signal is incident on a side surface of the optical waveguide 106.

A first electrode 112 and a second electrode 114 are formed on the graphene layer 110. The first electrode 112 and the second electrode 114 are in direct contact with the graphene layer 110, and given voltages such as a source voltage and a drain voltage may be respectively applied to the first electrode 112 and the second electrode 114.

The first electrode 112 includes a stem portion 2a positioned on the third dielectric material 108 and a plurality of branch portions 2b connected to the stem portion 2a and overlapping with the graphene layer 110. The second electrode 114 includes a stem portion 4a positioned on the third dielectric material 108, and a plurality of branch portions 4b connected to the stem portion 4a and overlapping with the graphene layer 110. The branch portions 2b of the first electrode and the branch portions 4b of the second electrode 114 alternate with each other.

A third electrode 116 is formed on the extended portion of the optical waveguide layer 120 exposed outside the third dielectric material 108. The third electrode 116 is in direct contact with the optical waveguide layer, and a given voltage such as a gate voltage is applied to the third electrode 116.

The first electrode 112, the second electrode 114, and the third electrode 116 may be made of a single layer or multiple layers of conductive metals such as Au, Ti, Pd, etc.

If the first electrode 112 and the second electrode 114 are made of the same material, the gate voltage Vg has to be applied to the optical waveguide 106 to cause current to flow between the two electrodes. However, if the first electrode 112 is formed of a double layer of Ti/Au and the second electrode 114 is formed of a double layer of Pd/Au to bring about a large difference in work function between the two electrodes, and the graphene layer 110 and the branch portions 2b and 4b are formed to be in direct contact with each other, current may flow between the two electrodes even without a gate voltage Vg.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of Symbols>

| | |
|---|---|
| 2a, 4a: stem portion | 2b, 4b: branch portion |
| 100: substrate | 102: first dielectric material |
| 104: second dielectric material | 106: optical waveguide |
| 108: third dielectric material | 110: graphene layer |
| 111: fourth dielectric material | |
| 112: first electrode | 114: second electrode |
| 116: third electrode | |
| 120: optical waveguide layer | |

What is claimed is:

1. A photodetector comprising:
   a substrate;
   a first dielectric material positioned on the substrate;
   an optical waveguide positioned on the first dielectric material;
   a second dielectric material positioned on the optical waveguide;
   a graphene layer positioned on the second dielectric material; and
   a first electrode and a second electrode that are positioned on the graphene layer.

2. The photodetector of claim 1, further comprising:
   a third dielectric material positioned on the first electrode and the second electrode; and
   a third electrode positioned on the third dielectric material, wherein the third electrode is positioned between the first electrode and the second electrode and overlaps with the optical waveguide.

3. The photodetector of claim 2, wherein a gate voltage is applied to the optical waveguide or the third electrode.

4. The photodetector of claim 1, wherein the refractive index of the optical waveguide is different from that of the first dielectric material.

5. The photodetector of claim 4, wherein the optical waveguide is made of silicon or silicon nitride.

6. The photodetector of claim 1, wherein an optical signal is applied to a side surface of the optical waveguide.

7. The photodetector of claim 6, wherein the optical signal is a digital signal containing 0 and 1.

8. The photodetector of claim 1, wherein the graphene layer is made of a single layer or multiple layers.

9. A photodetector comprising:
   a substrate;
   a first dielectric material positioned on the substrate;
   an optical waveguide layer positioned on the first dielectric material and including an optical waveguide and an extended portion connected to the optical waveguide;
   a second dielectric material positioned on the optical waveguide and overlapping with the optical waveguide;
   a graphene layer positioned on the second dielectric material; and
   a first electrode and a second electrode that are positioned on the graphene layer.

10. The photodetector of claim 9, wherein the first electrode and the second electrode are in direct contact with the graphene layer.

11. The photodetector of claim 10, wherein the first electrode and the second electrode are made of metals having different work functions.

12. The photodetector of claim 11, wherein the first electrode is made of Ti/Au, and the second electrode is made of Pd/Au.

13. The photodetector of claim 9, wherein the first electrode and the second electrode each comprises a stem portion overlapping with the second dielectric material and a plurality of branch portions connected to the stem portion and overlapping with the graphene layer,
wherein the branch portions of the first electrode and the branch portions of the second electrode alternate with each other.

14. The photodetector of claim 13, wherein a source voltage or a drain voltage is applied to the first electrode or the second electrode.

15. The photodetector of claim 9, further comprising a third electrode positioned on the extended portion of the optical waveguide layer.

16. The photodetector of claim 15, wherein the third electrode is in direct contact with the optical waveguide layer.

17. The photodetector of claim 9, wherein an optical signal is applied to a side surface of the optical waveguide.

18. The photodetector of claim 17, wherein the optical signal is a digital signal containing 0's and 1's.

19. The photodetector of claim 9, wherein the graphene layer is made of a single layer or multiple layers.

* * * * *